(12) United States Patent
Zhang et al.

(10) Patent No.: US 10,079,264 B2
(45) Date of Patent: Sep. 18, 2018

(54) SEMICONDUCTOR DEVICES WITH INTEGRATED THIN-FILM TRANSISTOR CIRCUITRY

(71) Applicant: Hong Kong Beida Jade Bird Display Limited, Hong Kong (CN)

(72) Inventors: Lei Zhang, Albuquerque, NM (US); Fang Ou, Monterey Park, CA (US); Qiming Li, Albuquerque, NM (US)

(73) Assignee: Hong Kong Beida Jade Bird Display Limited, Hong Kong (CN)

( * ) Notice: Subject to any disclaimer, the term of this patent is extended or adjusted under 35 U.S.C. 154(b) by 0 days.

(21) Appl. No.: 15/135,217

(22) Filed: Apr. 21, 2016

(65) Prior Publication Data

US 2017/0179192 A1    Jun. 22, 2017

Related U.S. Application Data

(60) Provisional application No. 62/270,375, filed on Dec. 21, 2015.

(51) Int. Cl.
| | |
|---|---|
| *H01L 23/29* | (2006.01) |
| *H01L 25/16* | (2006.01) |
| *H01L 27/15* | (2006.01) |
| *H01L 23/00* | (2006.01) |
| *H01L 27/12* | (2006.01) |

(52) U.S. Cl.
CPC ........... *H01L 27/156* (2013.01); *H01L 23/29* (2013.01); *H01L 24/73* (2013.01); *H01L 25/16* (2013.01); *H01L 25/167* (2013.01); *H01L 27/1255* (2013.01); *H01L 2224/73253* (2013.01); *H01L 2924/12041* (2013.01); *H01L 2924/13069* (2013.01); *H01L 2924/1426* (2013.01); *H01L 2924/1431* (2013.01)

(58) Field of Classification Search
CPC ......... H01L 23/29; H01L 24/73; H01L 25/16; H01L 27/156; H01L 27/1255; H01L 25/167
See application file for complete search history.

(56) References Cited

U.S. PATENT DOCUMENTS

| | | | |
|---|---|---|---|
| 6,150,668 A * | 11/2000 | Bao | ...................... H01L 27/3248 257/40 |
| 8,642,363 B2 | 2/2014 | Lau et al. | |
| 9,653,642 B1 * | 5/2017 | Raring | ................ H01L 33/0075 |
| 2002/0173215 A1 * | 11/2002 | Freidhoff | ................ B24B 29/02 442/417 |
| 2005/0057641 A1 * | 3/2005 | Ogihara | ..................... B41J 2/45 347/238 |

(Continued)

OTHER PUBLICATIONS

PCT International Search Report and Written Opinion, PCT Application No. PCT/US16/67788, dated Jan. 26, 2017, 12 pages.

(Continued)

*Primary Examiner* — Fazli Erdem
(74) *Attorney, Agent, or Firm* — Fenwick & West LLP

(57) ABSTRACT

Various embodiments include a semiconductor device with thin-film transistor (TFT) circuitry monolithically integrated with other non-TFT functional devices. One example is an integrated LED display panel, in which an array of LEDs is integrated with corresponding TFT driver circuitry. The TFT driver circuitry typically is an array of pixel drivers that drive the LEDs.

14 Claims, 10 Drawing Sheets

(56) References Cited

U.S. PATENT DOCUMENTS

| | | | | |
|---|---|---|---|---|
| 2005/0140283 A1* | 6/2005 | Lau | .................... | H01L 27/1266 313/506 |
| 2011/0285284 A1* | 11/2011 | Zhou | .................... | H01L 25/167 315/32 |
| 2011/0309378 A1* | 12/2011 | Lau | ...................... | H01L 27/156 257/88 |
| 2012/0223875 A1* | 9/2012 | Lau | ...................... | H01L 27/156 345/83 |
| 2012/0256814 A1* | 10/2012 | Ootorii | ................ | G09G 3/3208 345/82 |
| 2013/0126890 A1* | 5/2013 | Bedell | ................. | H01L 27/1218 257/76 |
| 2013/0306971 A1* | 11/2013 | Bedell | .................... | H01L 21/84 257/59 |
| 2014/0008667 A1 | 1/2014 | Lau et al. | | |
| 2014/0098556 A1* | 4/2014 | von Malm | ................ | F21K 9/00 362/543 |
| 2014/0191246 A1* | 7/2014 | Oraw | .................... | H01L 25/167 257/76 |
| 2014/0353698 A1* | 12/2014 | Chen | .................. | H01L 33/0079 257/94 |
| 2015/0021599 A1* | 1/2015 | Ridgeway | ............ | C23C 16/345 257/43 |
| 2015/0340346 A1* | 11/2015 | Chu | .................... | H01L 25/0753 257/89 |
| 2016/0268239 A1* | 9/2016 | Shen | .................... | H01L 25/167 |
| 2016/0293586 A1* | 10/2016 | Ghosh | .................. | H01L 25/167 |
| 2016/0336484 A1* | 11/2016 | McGroddy | ........... | H01L 27/016 |
| 2017/0213502 A1* | 7/2017 | Henry | .................... | G09G 3/32 |

OTHER PUBLICATIONS

U.S. Appl. No. 62/214,395, filed Sep. 4, 2015, Inventors Lei Zhang et al.

\* cited by examiner

SEMICONDUCTOR DEVICES WITH INTEGRATED THIN-FILM TRANSISTOR CIRCUITRY

CROSS-REFERENCE TO RELATED APPLICATION(S)

This application claims priority under 35 U.S.C. § 119(e) to U.S. Provisional Patent Application Ser. No. 62/270,375, "Monolithically Integrated TFT Driven LED Array Display Panels and Methods of Making Such," filed Dec. 21, 2015. The subject matter of all of the foregoing is incorporated herein by reference in their entirety.

BACKGROUND

1. Field of the Invention

This disclosure relates generally to semiconductor devices with integrated thin-film transistor (TFT) circuitry, for example displays with epitaxially grown light emitting diodes (LEDs) integrated with corresponding TFT pixel drivers.

2. Description of Related Art

Active matrix liquid-crystal displays and organic light emitting diode (OLED) displays combined with thin-film transistor technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional TFT-LCD displays and TFT-OLED displays suffer from low light efficiency, causing high power consumption and limited battery operation time. Conventional inorganic semiconductor light emitting diodes (LED) have demonstrated superior light efficiency, which makes active matrix LED displays more desirable for battery operated electronics. However, in active matrix LED displays, combining TFT driver circuitry with light emitting diodes (LED) has drawbacks. For example, the TFT driver circuitry typically is fabricated on one wafer and the LEDs fabricated on a separate wafer. Devices on the two wafers may then be connected by solder bumps bonding the wafers. Alternately, LEDs may be individually picked and placed onto the wafer containing the TFT circuitry. However, these types of processes are inefficient and costly.

As a result, there is a need for better integration of TFT circuitry with non-TFT circuitry (e.g., LEDs).

SUMMARY

Various embodiments include a semiconductor device with thin-film transistor (TFT) circuitry monolithically integrated with other non-TFT functional devices. One example is an integrated LED display panel, in which an array of LEDs is integrated with corresponding TFT driver circuitry. The TFT driver circuitry typically is an array of pixel drivers that drive the LEDs.

In one aspect, LEDs are epitaxially grown on a substrate to form an LED wafer containing multiple LED dies. The TFT driver circuitry is then directly fabricated onto the same substrate. The array of TFT pixel drivers are electrically connected to the array of LEDs to drive the LEDs.

In another approach, the TFT driver circuitry is grown on a substrate and the LEDs are fabricated on a separate substrate. The LED wafer is then flip chip bonded to the TFT wafer by bonding the LEDs to the TFT pixel drivers. In this way, the LEDs are monolithically integrated with the TFT pixel drivers.

In addition to LEDs, other examples of non-TFT functional devices include vertical cavity surface-emitting lasers (VCSELs), distributed feedback lasers (DFBs), silicon photonic devices, photodetectors, micro-electro-mechanical system (MEMS) devices and power electronic devices. In addition to TFT driver circuitry, other examples of TFT circuitry include current drivers, voltage drivers, transimpedance amplifiers, logic circuits, and other TFT circuitry that controls non-TFT functional devices.

Other aspects include components, devices, systems, improvements, methods and processes including manufacturing methods, applications, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1A:
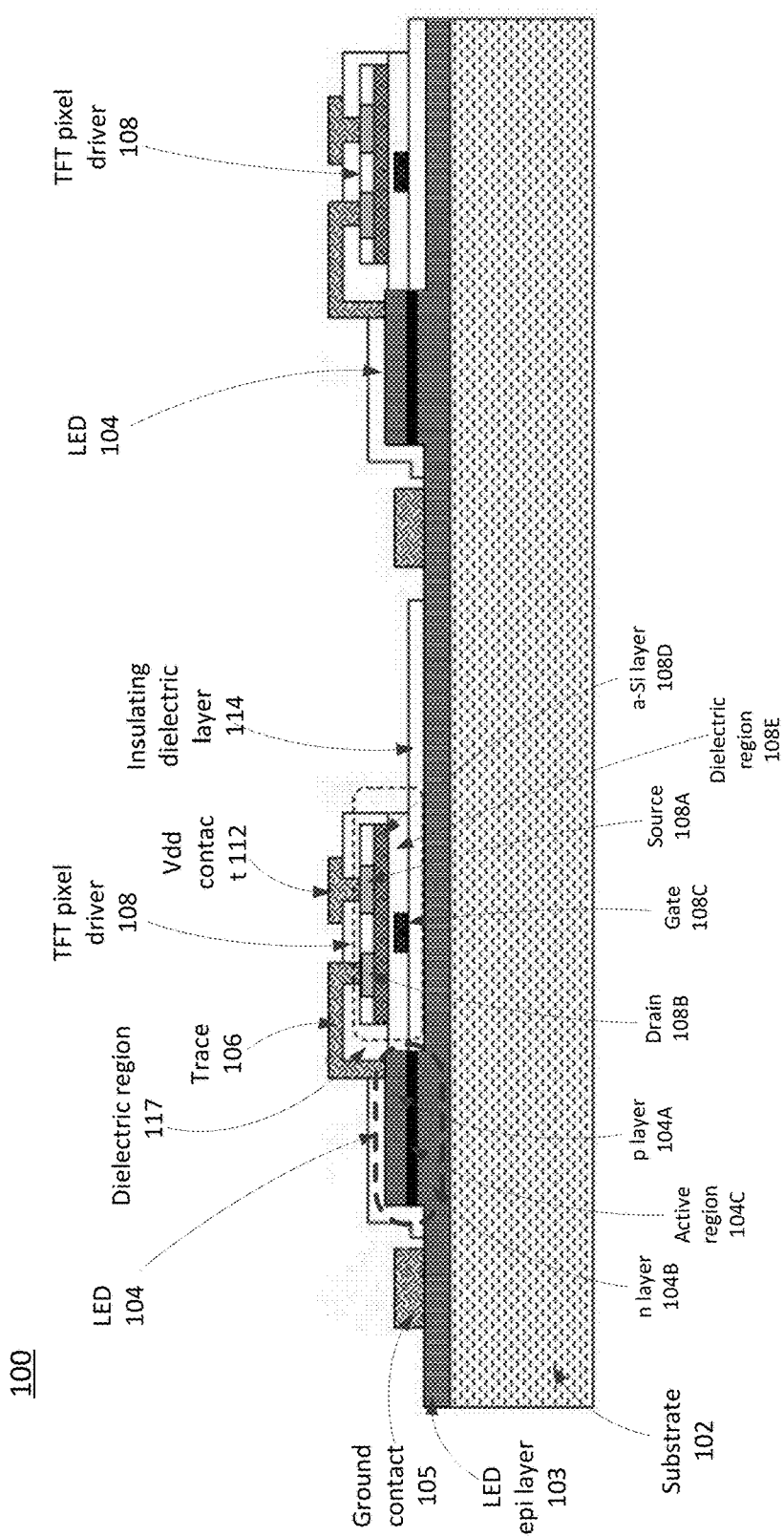
FIGS. 1A-1D are cross-sectional views of different examples of display panels with TFT pixel drivers integrated onto LED dies, according to various embodiments.

FIG. 1A is a cross-sectional view of one example of a display panel 100 with TFT pixel drivers 108 integrated with LEDs 104 on an LED die. In FIG. 1A, an array of LEDs 104 is first epitaxially grown on a substrate 102, forming an LED wafer (or a wafer containing multiple LED dies). The TFT driver circuitry, which is an array of TFT pixel drivers 108, is then directly fabricated on the LED wafer. In this example, the TFT pixel driver 108 is a bottom gate TFT transistor and an insulating dielectric layer 114 separates the bottom gate 108C from the underlying substrate 102.

For clarity, FIG. 1A shows only two LEDs 104 and two TFT pixel drivers 108 on the display panel 100, with one pixel driver 108 connected to drive one LED 104. It should be understood that the full display panel 100 will include many LEDs 104 and TFT pixel drivers 108. In a fully programmable display panel, the LEDs and pixel drivers are arranged in arrays to form an array of individually addressable pixels, preferably color pixels. In alternate embodiments, the display panel may have a more limited programmability and the pixels may be arranged in different geometries. In addition, there does not have to be a one to one correspondence between pixel drivers and LEDs. For example, each pixel driver could drive two or more LEDs that are electrically connected in parallel.

Returning to FIG. 1A, in more detail, the integrated LED display panel 100 is fabricated as follows. The substrate 102 is the substrate on which both the LEDs 104 and TFT pixel drivers 108 are fabricated. In one embodiment, the substrate 102 is a GaAs substrate. In another embodiment, the substrate 102 is a transparent substrate, for example a sapphire substrate. In this case, images on the display panel 100 can be seen through the bottom side of the display panel, in addition to from the top side. For convenience, "bottom" "below" and similar terms refers to the direction towards the substrate 102 (the down direction in FIG. 1A) and "top" "above" and similar terms refers to the direction towards the LEDs 104 and TFT circuitry (the up direction in FIG. 1A). Other example substrates include GaP, InP, SiC, ZnO, and Si substrates.

The epitaxial layer of the array of LEDs 104 is grown on the substrate 102. The bottom epitaxial layer 103 forms the bottom n layer 104B of the LED 104. Additional layers are grown by epitaxy to form a p layer 104A and an active region 104C between the n and p layers. A portion of the epitaxial layers is removed through the active layer to expose the n layer 103, isolating the individual LEDs 104 from each other. The wafer, which will be referred to as an LED wafer, now contains a substrate with an array of LEDs 104 epitaxially grown on the substrate. Eventually, the n layer 104B of the LED 104 will be grounded through a ground contact 105, and the p layer 104A will be connected to the TFT pixel driver 108 via a conductive trace 106.

The TFT driver circuitry is then integrated onto the LED wafer. An insulating dielectric layer 114 is formed on top of the exposed LED epitaxial layer 103, laterally located between adjacent LEDs 104. The insulating dielectric layer 114 isolates the gate 108C of each TFT pixel driver 108 from the otherwise exposed underlying n layer 103. The insulating layer 114 can include SiO2, SiNx, SiONx Al2O3, AlN, and other dielectric materials that preferably can withstand temperatures of at least 300 C without significant decomposition or deformation. Fabrication methods can include PECVD, LPCVD, sputtering deposition, e-beam deposition, and atomic layer deposition. The other white regions around the TFT pixel driver 108 are also dielectric regions 117, typically used for electrical insulation and/or passivation. The dielectric regions 117 can be made of the same or different materials as the dielectric layer 114.

An array of TFT pixel drivers 108 is directly fabricated on top of the insulating dielectric layer 114. Each of the individual TFT pixel drivers 108 is electrically connected to control a corresponding LED 104. In one embodiment, the TFT pixel drivers and LEDs are formed in addressable arrays, so that image data can be conveniently read into each pixel of the display panel.

In this example, the TFT pixel driver 108 is a current driver for the LED 104 and typically requires two transistors and a capacitor (2T1C configuration). Only one driving TFT transistor of the TFT pixel driver 108 is shown in FIG. 1A and the transistor is directly connected to the LED 104. The other transistor(s) and capacitor (not shown in FIG. 1A) are connected to the gate 108C of the driving TFT transistor shown here. The other transistor(s) set the gate voltage of the gate 108C and the capacitor maintains the gate voltage of the gate 108C while the circuitry scans/sets the rest of the pixels.

Figure 6:
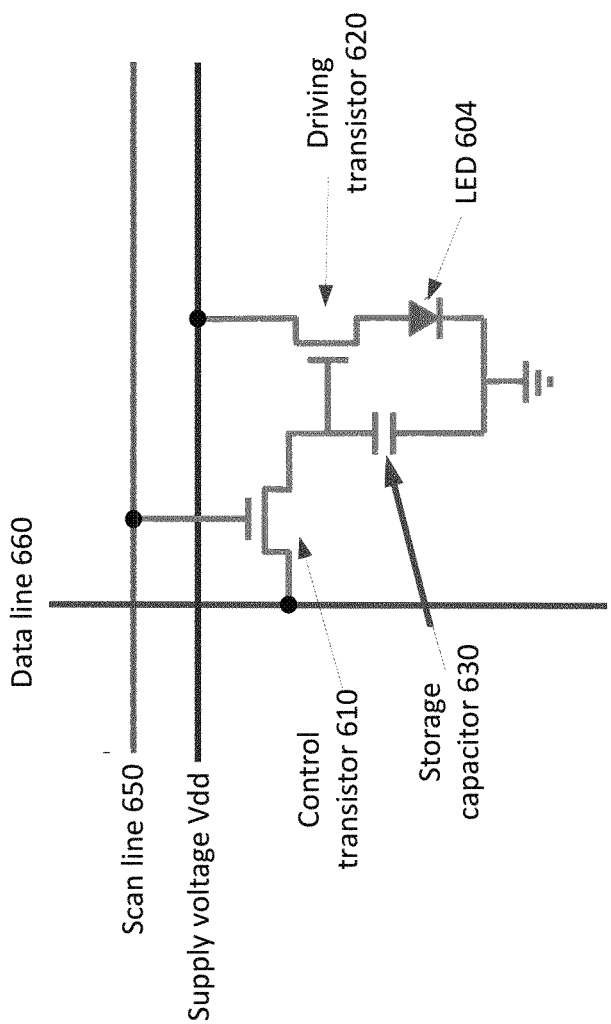
FIG. 6 is a circuit diagram of a TFT pixel driver, according to one embodiment.

FIG. 6 is a circuit diagram of such a TFT pixel driver 608. In this example, the TFT pixel driver 608 includes two transistors and one capacitor 630, with one transistor being a control transistor 610 and the other being a driving transistor 620. In this example, the control transistor 610 is configured with its gate connected to a scan signal bus line 650, its one source/drain connected to a data signal bus line 660, and the other drain/source connected to the storage capacitor 630 and to the gate of the driving transistor 620. One source/drain of the driving transistor 620 is connected to a voltage supply, Vdd, and the other drain/source is connected to the p-electrode of the LED 604. The n-electrode of the LED 604 is connected to the capacitor 630 and to ground, as described above in FIG. 1A. In this example, when the scan signal 650 opens the gate of the control transistor 610, the data signal 660 charges the storage capacitor 630 and sets the driving transistor 620's gate voltage, which controls the current flow through the LED 604. The storage capacitor 630 here is used to maintain the gate voltage of the driving transistor 620, thus maintaining the current flowing through the LED 604 during the time that the scan signal 650 is setting other pixels. Other pixel driver designs will be apparent, for example as described in U.S. Provisional Patent Appl. No. 62/214,395, "Monolithic Active or Passive Matrix LED Array Display Panels and Display Systems Having the Same," which is incorporated herein by reference.

Returning to FIG. 1A, the driving TFT transistor shown in FIG. 1A includes a source 108A, gate 108C and drain 108B, an amorphous silicon layer 108D and a dielectric region 108E. The amorphous silicon layer 108D is a thin film silicon layer that functions as a semiconductor material to form transistors. If the amorphous silicon layer 108D is between the LED 104 and the viewer, then it preferably is thin enough to be transparent to allow light to pass through. If it is not in the optical path from the LED 104, then it does not have to be transparent. The dielectric region 108E isolates the source/drain 108A/B from the gate 108C. The gate 108C controls current flow between the source and drain.

In FIG. 1A, the source 108A is connected to an external voltage supply Vdd via contact 112, and the drain 108B is connected to the p layer 104A of the LED 104. When the gate is turned on, current flows from Vdd to ground through the TFT pixel driver 108 and LED 104. When the gate is turned off, current flow stops. In this way, the LED 104 can be controlled. The gates 108C of the pixel drivers 108 are individually controllable. In this way, the entire display panel can be controlled. Additionally, the LEDs 104 on the display panel 100 can be controlled in a binary fashion (either fully on or fully off, and grayscale is achieved by temporal duty cycle), or they can be controlled in an analog fashion. In FIG. 1A, the TFT pixel driver 108 is a bottom-gate TFT transistor.

FIG. 1A is just an example. Other designs will be apparent. As one example, the LED 104 is not required to have p layer 104A on top and n layer 104B on bottom. The p layer could be on the bottom. As another example, the LED is a nanowire core-shell LED, where the n-type GaN nanowire forms the core and the light-emitting active region and a p-type GaN layer form the shell covering the surface of the nanowire core.

Other designs can also be used for the TFT pixel driver 108. As one example, the TFT transistor used in the TFT pixel driver is not required to be a bottom-gate TFT as shown in FIG. 1A. It can also be a top-gate TFT. The driving transistor can be either P type field effect transistor (PFET) or N type field effect transistor (NFET). Additional examples of pixel driver designs are described in U.S. Provisional Patent Appl. No. 62/214,395, "Monolithic Active or Passive Matrix LED Array Display Panels and Display Systems Having the Same," which is incorporated herein by reference.

In FIG. 1A, the trace 106 electrically connects the TFT pixel driver 108 and the LED 104. The overall pixel has three additional connections to outside the pixel: one to Vdd through contact 112, one to ground via contact 105 and one from gate 108C to receive the signal controlling the pixel. These connections can also be made in other ways.

Figure 1B:
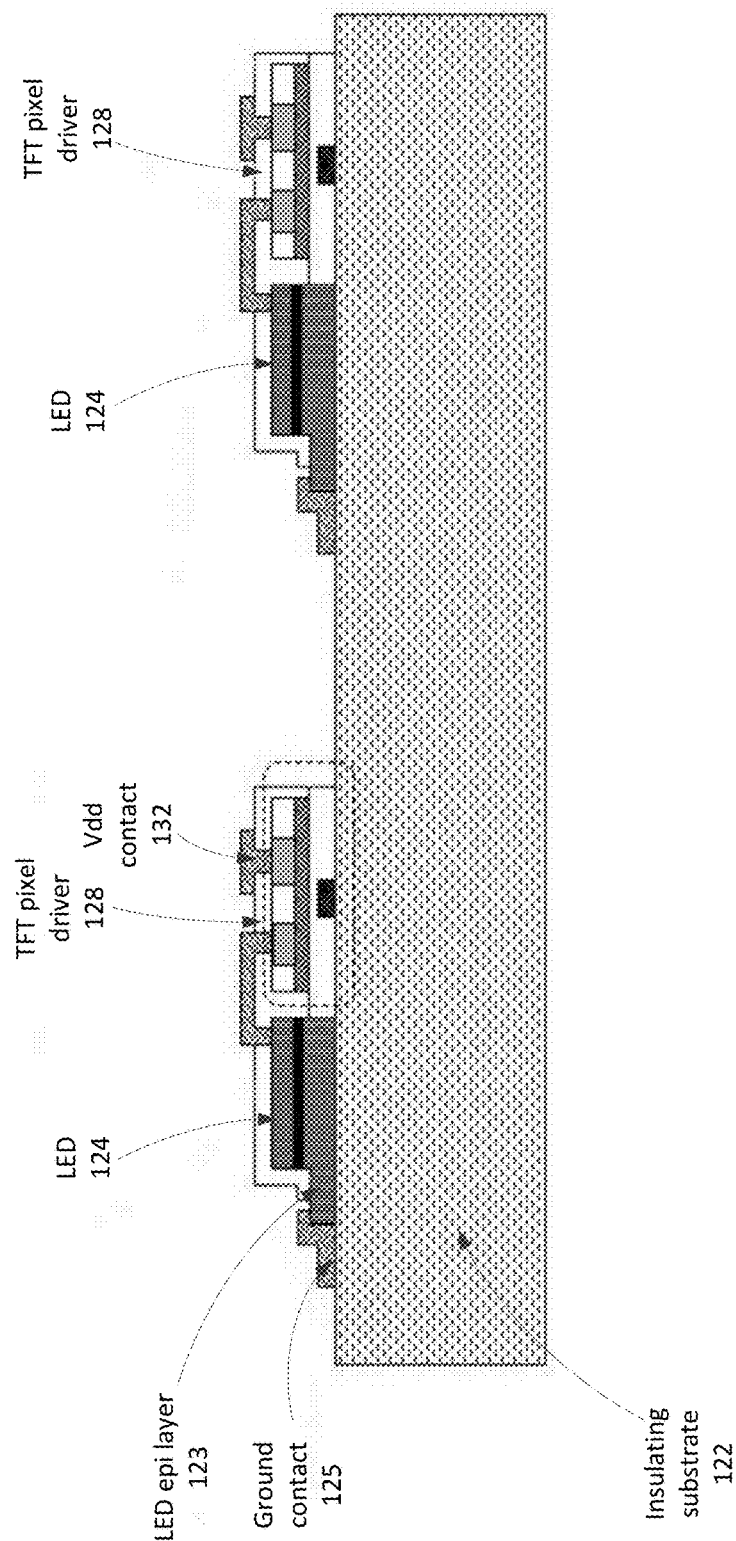

FIG. 1B is a cross-sectional view of another example display panel 120 with TFT pixel drivers 128 integrated with LEDs 124 on an LED die. Similar to the display panel 100 shown in FIG. 1A, the display panel 120 shown in FIG. 1B includes LED epitaxial layers and TFT driver circuitry integrated on a substrate 122. In FIG. 1B, the substrate 122 is an insulating substrate. The insulating substrate 122 can be a transparent substrate, for example, a sapphire substrate for blue LEDs or green LEDs to form a transparent display that is transmissive from the bottom side of the display panel 120, which further allows images of the display panel to be seen through from both sides.

The LED epitaxial layers are grown on insulating substrate 122 to form an array of LEDs 124. The epitaxial layers are removed down to the substrate 122 to isolate the individual LEDs 104.

Because the substrate 122 is insulating, there is no additional insulating dielectric layer (such as layer 114 in FIG. 1A). Instead, the TFT pixel drivers 128 are integrated directly onto the insulating substrate 122. The TFT pixel drivers 128 are bottom-gate TFT transistors.

Similar to the display panel 100 shown in FIG. 1A, a supply voltage Vdd is connected to the source of TFT pixel driver 128 via the Vdd contact 132. The drain of the TFT pixel driver 128 is connected to the p layer of LED 124. The n layer of LED 124 is connected to ground via the ground contact 125. The gate of TFT pixel driver 128 is individually addressable and controls the LED is the same manner as display panel 100 of FIG. 1A.

Figure 1C:
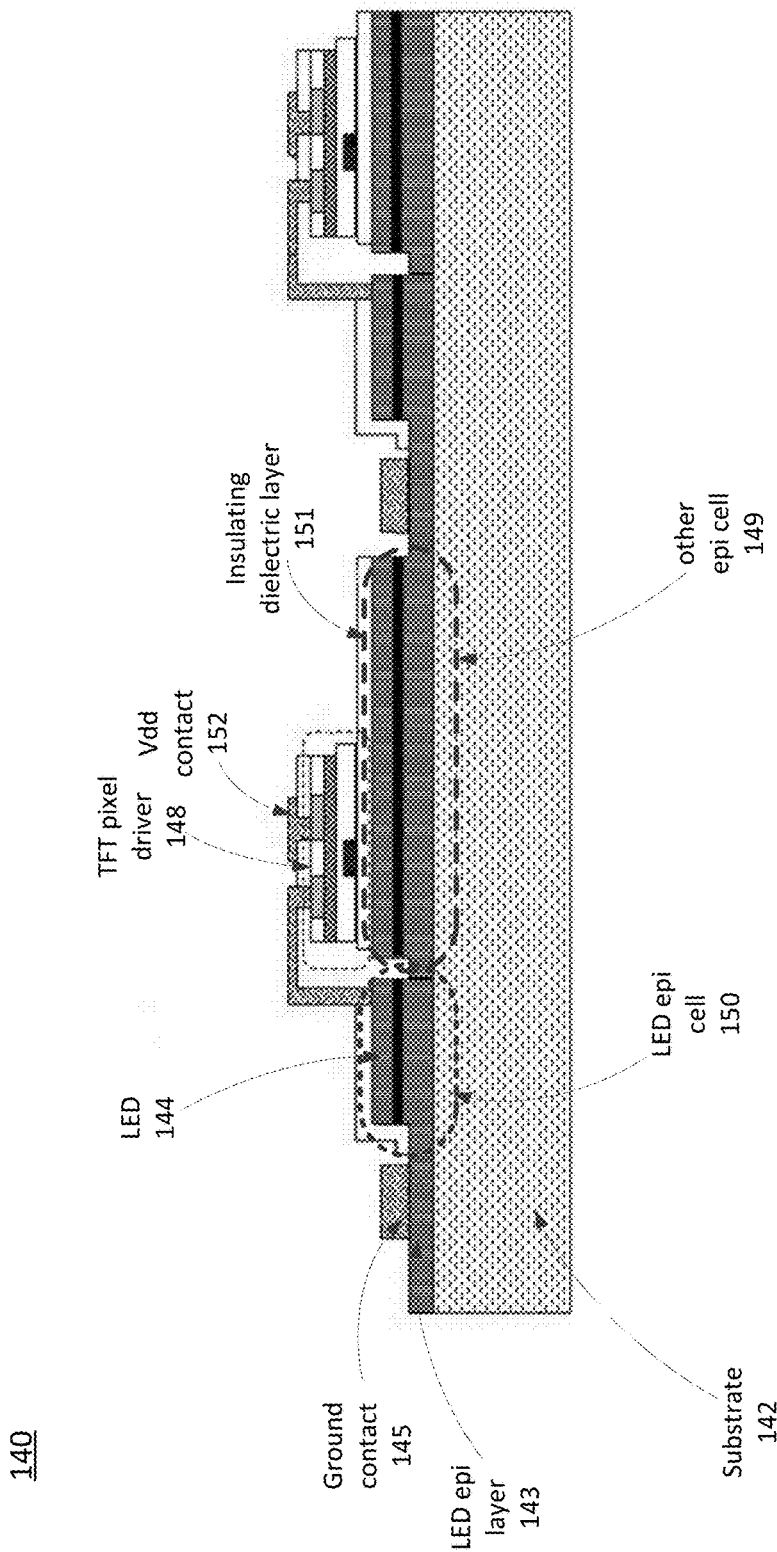
Figure 1D:
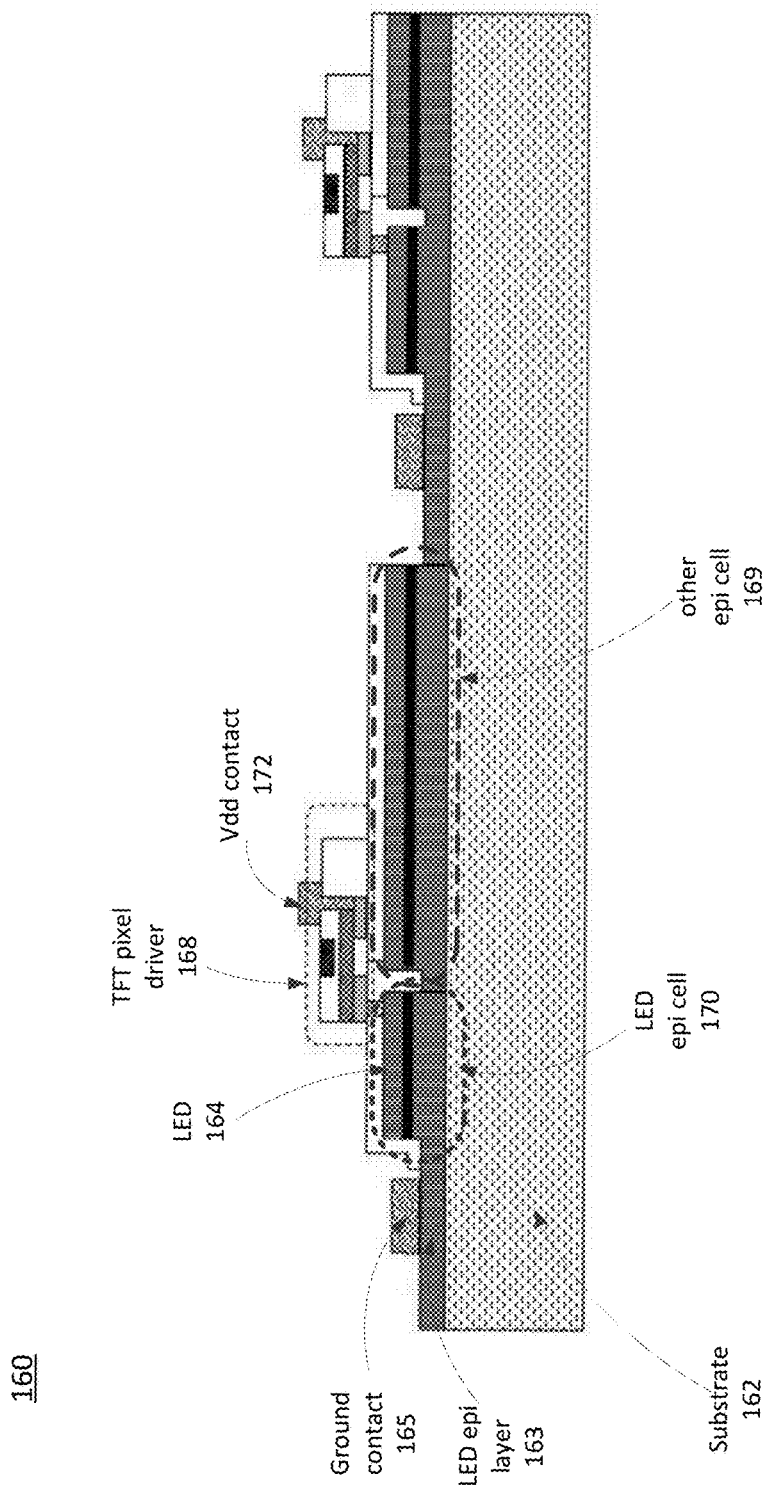

FIGS. 1C and 1D show other example LED display panels 140,160 with TFT pixel drivers 148,168 integrated with LEDs 144,164 on an LED die. In these examples, epitaxial layers are grown on the substrate 142 and 162. The epitaxial layers are divided laterally into different cells. Some of these cells 150,170 are used to form the LEDs 144,164. For convenience, these lateral cells will be referred to as LED epitaxial cells 150,170. Other cells 149,169 are used to support the TFT pixel drivers 148,168.

In FIG. 1C, the TFT pixel driver 148 is a bottom-gate TFT transistor. An insulating dielectric layer 151 is fabricated on top of the epitaxial cell 149, and the bottom-gate TFT transistor 148 is directly fabricated on top of the insulating dielectric layer 151. The TFT pixel driver 148 and LED 144 are connected similarly as in FIGS. 1A-1B. A supply voltage Vdd is connected to the source of TFT pixel driver 148 via the Vdd contact 152. The drain of TFT pixel driver 148 is connected to the p layer of LED 144. The n layer of LED 144 is connected to ground via the ground contact 145. The gate of TFT pixel driver 148 is individually addressable and controls the LED 144.

In FIG. 1D, the TFT pixel driver 168 is a top-gate TFT transistor. In this example, the TFT pixel driver 168 is laterally positioned partly above the LED epitaxial cell 170, facilitating contact from the drain of the pixel driver 168 to the p layer of the LED 164. The TFT pixel driver 168 is laterally positioned partly over the non-LED epitaxial cell 169. Functionally, the electrical connections between the TFT pixel driver 168 and LED 164 are the same as in FIGS. 1A-1C. A supply voltage Vdd is connected to the source of TFT pixel driver 168 via the Vdd contact 172. The drain of TFT pixel driver 168 is connected to the p layer of LED 164. The n layer of LED 164 is connected to ground via the ground contact 165. The gate of TFT pixel driver 168 is individually addressable and controls the LED 164.

As described below, both single-color and multi-color LED display panels can be realized by the device structures shown above in FIGS. 1A-1D. Single-color LED display panels can be implemented by an LED array in which all the LEDs are the same color. In an alternate design, a single-color display panel may be implemented by different color LEDs that are controlled in a way to produce a single color. For example, if red, green and blue LEDs are always turned on together (e.g., do not have independent pixel drivers), that can be used to implementation a single-color white display. Multi-color displays can be realized by using different color LEDs and/or different color phosphors or color converting nano-particles, for example. Some examples are shown in FIGS. 2A-2B.

Figure 2:
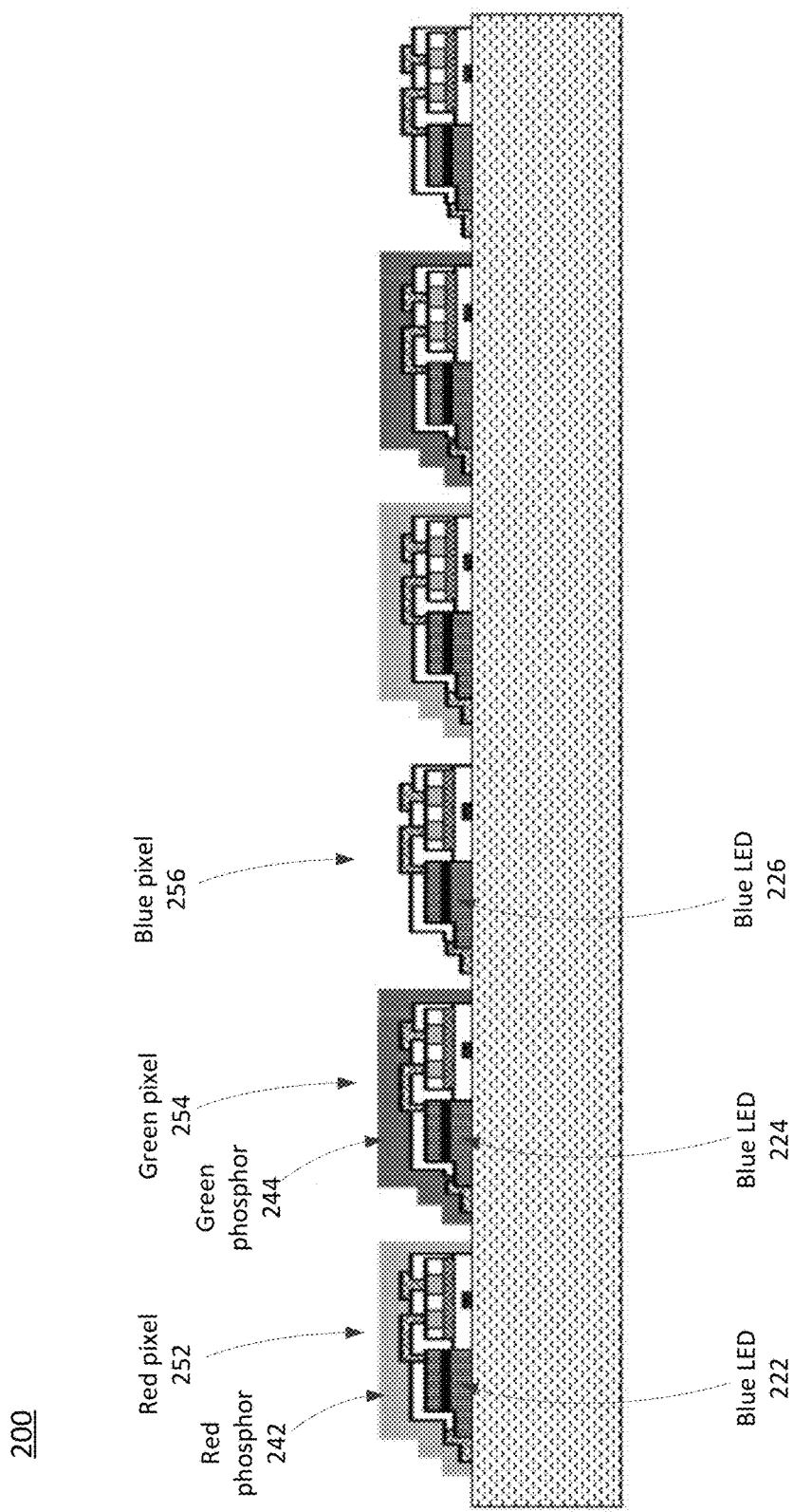
FIG. 2 is a cross-sectional view of an example of a multi-color display panel using same color LEDs and different color phosphors, according to one embodiment.

FIG. 2 is a cross-sectional view of one example multi-color LED display panel 200 with TFT driver circuitry integrated with blue LEDs 222,224,226 on a same substrate, according to one embodiment. In FIG. 2, the display panel 200 includes pairs of blue LEDs and TFT pixel drivers, forming individual pixels 252,254,256. The TFT-LED structure for each pixel is the same as shown in FIG. 1B, although any other structures could also be used. Although the LEDs 222,224,226 are all blue LEDs, different phosphors are used to implement different colors. Pixel 252 uses a red phosphor 242 excited by the blue LED 222 to implement a red pixel for the display panel. Pixel 254 uses a green phosphor 244 excited by the blue LED 224 to implement a green pixel for the display panel. Pixel 256 is a blue pixel so no phosphor is required for the blue LED 226. In another embodiment, nano-particles may be used instead of phosphors. Apart from direct color conversion, which converts LED emission wavelengths to various color wavelengths directly, the LED emission wavelengths can be converted first into white light (e.g., by phosphors and/or nano-particles) and then color filters used to realize the various color pixels to form multi-color display panels.

Additionally, apart from blue LEDs, other wavelength LEDs may be combined with other types of phosphors to form a multi-color display panel. In one approach, ultraviolet (UV) LEDs are used instead of blue LEDs and every pixel includes a phosphor (or other color-converting element): red phosphor for the red pixel, green phosphor for the green pixel, and blue phosphor for the blue pixel. A multi-color LED display panel can also be formed without phosphor layers by using different color LEDs.

Figure 3:
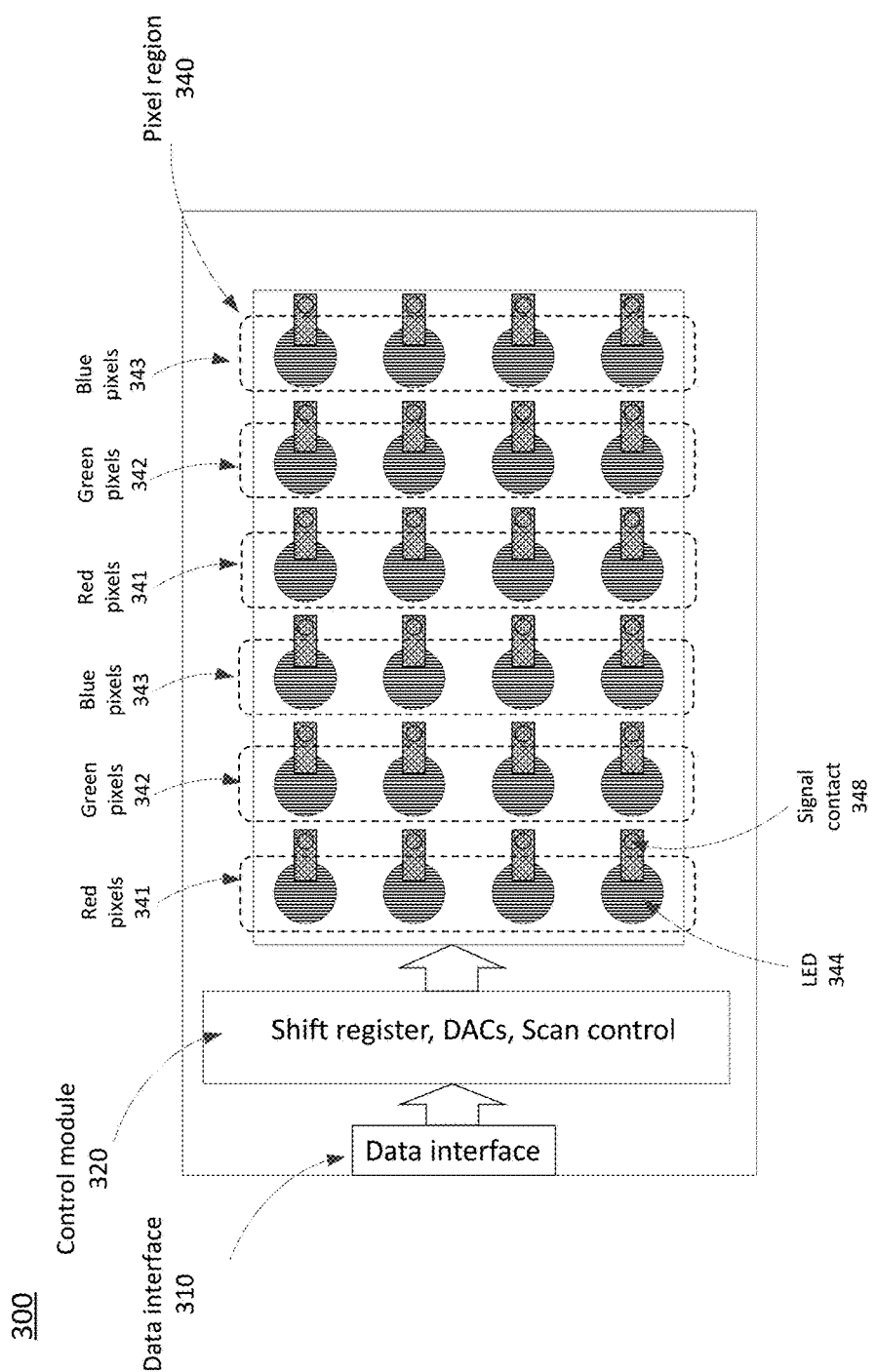
FIG. 3 is a top view of an example LED display panel, according to one embodiment.

FIG. 3 is a top view of an example LED display panel 300, according to one embodiment. The display panel 300 includes a data interface 310, a control module 320 and a pixel region 340. The data interface 310 receives data defining the image to be displayed. The source(s) and format of this data will vary depending on the application. The control module 320 receives the incoming data and converts it to a form suitable to drive the pixels in the display panel. The control module 320 may include digital logic and/or state machines to convert from the received format to one appropriate for the pixel region 340, shift registers or other types of buffers and memory to store and transfer the data, digital-to-analog converters and level shifters, and scan controllers including clocking circuitry.

The pixel region 340 includes an array of pixels. The pixels include LEDs 344 monolithically integrated with TFT pixel drivers, for example as described above or in the following figures. In this example, the display panel 300 is a color RGB display panel. It includes red, green and blue pixels, arranged in columns. Columns 341 are red pixels, columns 342 are green pixels and columns 343 are blue pixels. Within each pixel, an LED 344 is controlled by a TFT pixel driver. The pixel makes contact to a supply voltage and ground, and also to a control signal, according to the embodiments shown previously. For clarity, only the contact 348 for the LED current driving signal, connecting the p-electrode of the LED and the drain of the TFT, is shown in FIG. 3. The ground connection (between n-electrode and system ground), the Vdd connection (between source of the TFT and system Vdd), and the control signal connection to the gate of the TFT are made in accordance with various embodiments described previously. In one approach, row and column addressing or scanning is used to supply signals to these contacts 348.

FIG. 3 is merely a representative figure. Other designs will be apparent. For example, the colors do not have to be red, green and blue, and there do not have to be equal numbers of each color pixel. They also do not have to be arranged in columns or stripes. A set of four color pixels could be arranged as a 2×2 square, for example. Individual pixel cells could also be arranged to share row or column addressing, thus reducing the total number of row or column traces. As one example, apart from the arrangement of a square matrix of pixels shown in FIG. 3, an arrangement of hexagonal matrix of pixels can also be used to form the display panel 300.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 1A-1D, the LEDs and TFT pixel drivers are arranged in a line: LED, its corresponding TFT pixel driver, next LED, its corresponding TFT pixel driver, and so on. This was done purely for clarity of illustration. Referring to FIG. 1A, the TFT pixel drivers could also be located "behind", "in front of" or "on top of" the LED, instead of "beside" it.

Different types of display panels can be fabricated. For example, the resolution of a display panel can range typically from 8×8 to 3840×2160. Common display resolutions include QVGA with 320×240 resolution and an aspect ratio of 4:3, WXGA with 1366×768 resolution and an aspect ratio of 16:9, HD with 1280×720 resolution, FHD 1080p with 1920×1080 resolution, 4K UHD with 3840×2160 resolution, and GXGA or QSXGA with a resolution of 2560×2048 and an aspect ratio of 5:4. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness. Example application include direct viewing display screens, light engines for home/office projectors and portable electronics such as smart phones, laptops, wearable electronics, and retinal projections. The power consumption can vary from as low as a few miliwatts for retinal projectors to as high as kilowatts for large screen outdoor displays, projectors, and smart automobile headlights. In terms of frame rate, due to the fast response (nano seconds) of inorganic LEDs, the frame rate can be as high as kHz, or even MHz for small resolutions.

Figure 4:
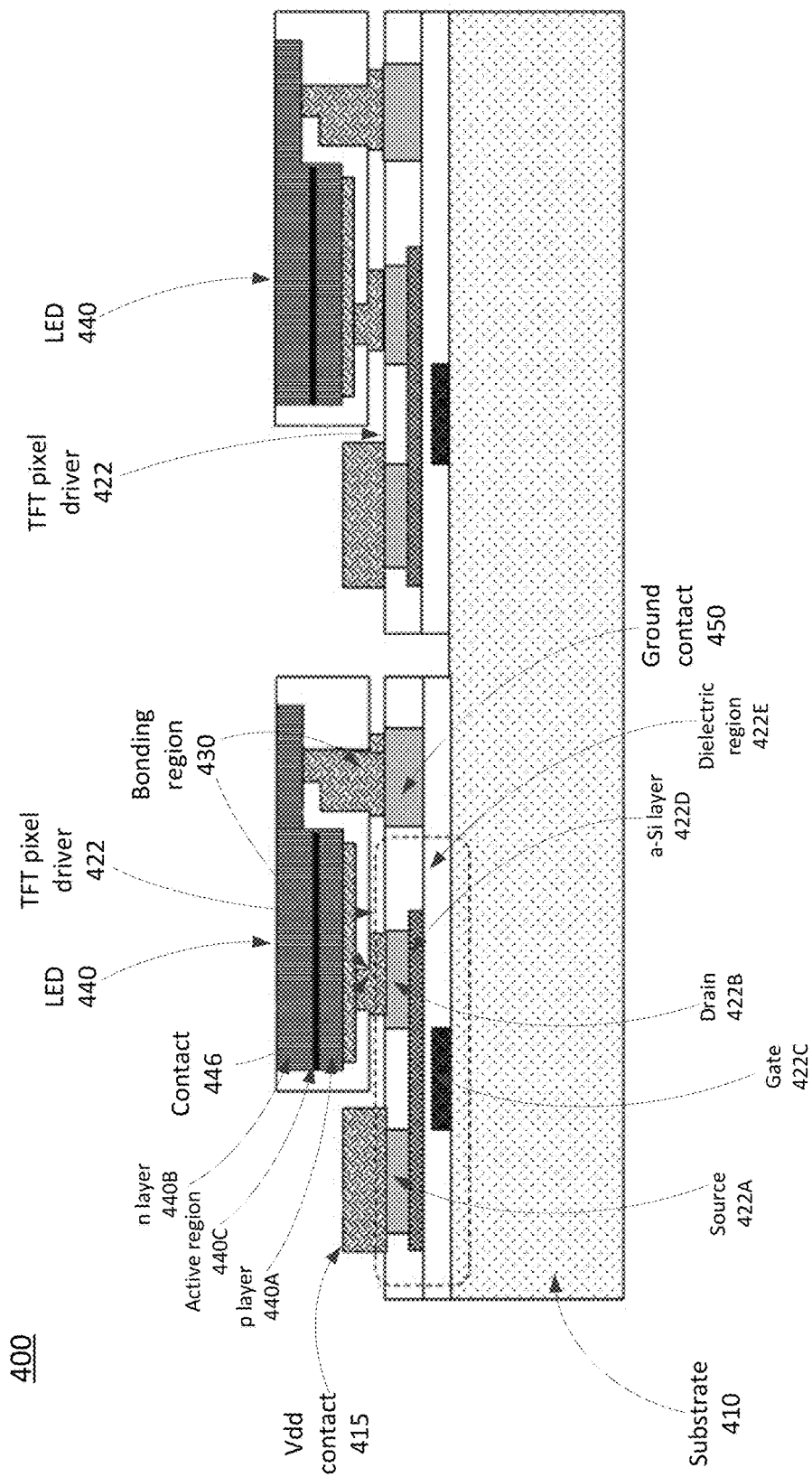
FIG. 4 is a cross-sectional view of an example LED display panel with LEDs monolithically integrated onto a substrate containing TFT driver circuitry, according to one embodiment.

FIG. 4 is a cross-sectional view of an example LED display panel with LEDs monolithically integrated by bonding onto a die containing TFT driver circuitry, according to one embodiment. In FIG. 4, the display panel 400 includes TFT pixel drivers 422 fabricated on a substrate 410. For convenience, this may be referred to as a TFT wafer. An array of LEDs 440 is then monolithically integrated onto the TFT wafer by bonding. The TFT pixel driver 422 includes a source 422A, gate 422C and drain 422B, an amorphous silicon layer 422D and a dielectric region 422E. The LED 440 includes a p layer 440A, an n layer 440B, and an active region 440C between the two. The source 422A of the TFT pixel driver is connected to a supply voltage Vdd by contact 415. The drain 422B is connected to the p layer 440A of the LED by contact 446, and the n layer 440B is connected to ground by contact 450.

In one approach, the display panel 400 is fabricated as follows. The TFT pixel drivers 422 are first fabricated on substrate 410. For example, the active layer (a-Si, LTPS—Low Temperature Poly-Silicon, oxide semiconductor IGZO—Indium Gallium Zinc Oxide) of the TFT is first deposited or grown on the substrate. Then the active layer is patterned, etched, isolated, and cross connected to form the functional TFT circuitry. This will be referred to as the TFT wafer (or dies after dicing) or the TFT back panel. The array of LEDs 440 are epitaxially grown and fabricated on a separate substrate (not shown), which will be referred to as the LED wafer. The LED wafer is then flip chip bonded to the TFT wafer. In particular, for the example shown in FIG. 4, the p contact 446 from the LED is bonded to the drain 422B of the TFT pixel driver, and a contact to the n layer 440B of the LED is bonded to a contact to ground 450. In FIG. 4, the bond regions are labelled as 430. In one approach, the bonding is based on ohmic bonding, for example, a metal bonding. After bonding, the substrate for the LED wafer is removed, which can be done by wet chemical etching or laser lift off process. The result is an array of LEDs that has been monolithically integrated with a TFT back panel that contains the corresponding TFT driver circuitry. In alternate embodiments, the substrate for the LED wafer may not be removed.

Figure 5A:
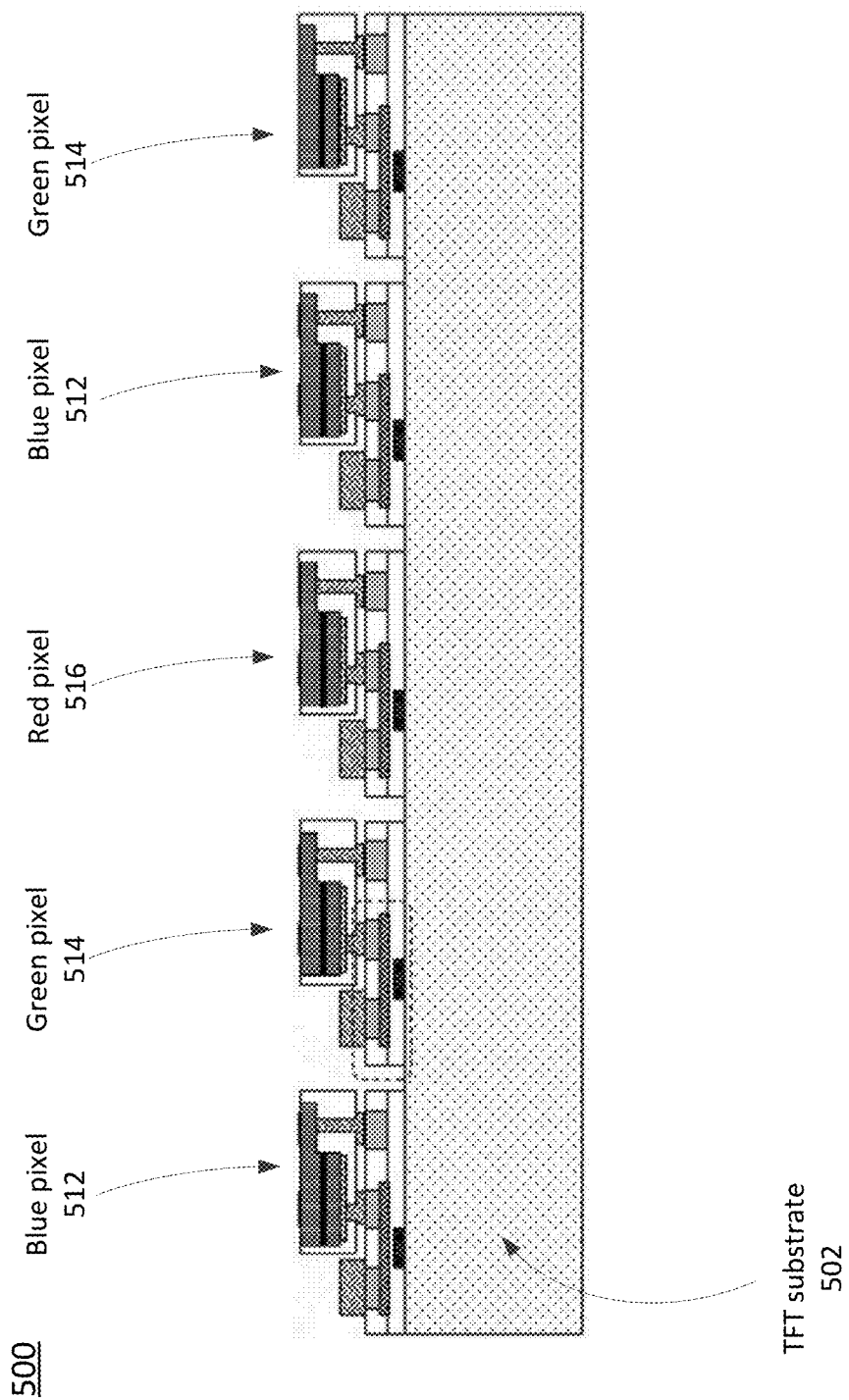
FIG. 5A is a cross-sectional view of a multi-color TFT-LED display panel fabricated via wafer bonding and substrate removal, according to one embodiment.

FIG. 5A is a cross-sectional view of a multi-color TFT-LED display panel fabricated via wafer bonding and substrate removal, according to one embodiment. In this example, the TFT driver pixels are fabricated on the substrate 502. Then, three different color LEDs are monolithically integrated onto the TFT wafer, one color at a time. First, an LED wafer with red color LEDs is bonded to the TFT wafer. The LED substrate is removed, leaving the red pixels 516. Then an LED wafer with green color LEDs is bonded to the TFT wafer and the LED substrate is removed, leaving the green pixels 514. Then an LED wafer with blue color LEDs is bonded to the TFT and the LED substrate is removed, leaving the blue pixels 512. The resulting display panel 500 has red, green and blue pixels. More detailed information about the fabrication method of wafer bonding and substrate removal can be found in U.S. Provisional Patent Appl. No. 62/273,376, "Method of Making RGB LED Micro-Display by Multiple Alignment Bonding and Substrate Removal Process," which is incorporated by reference herein. A single-color display panel can be fabricated by using LED wafer(s) with just a single color LED.

Figure 5B:
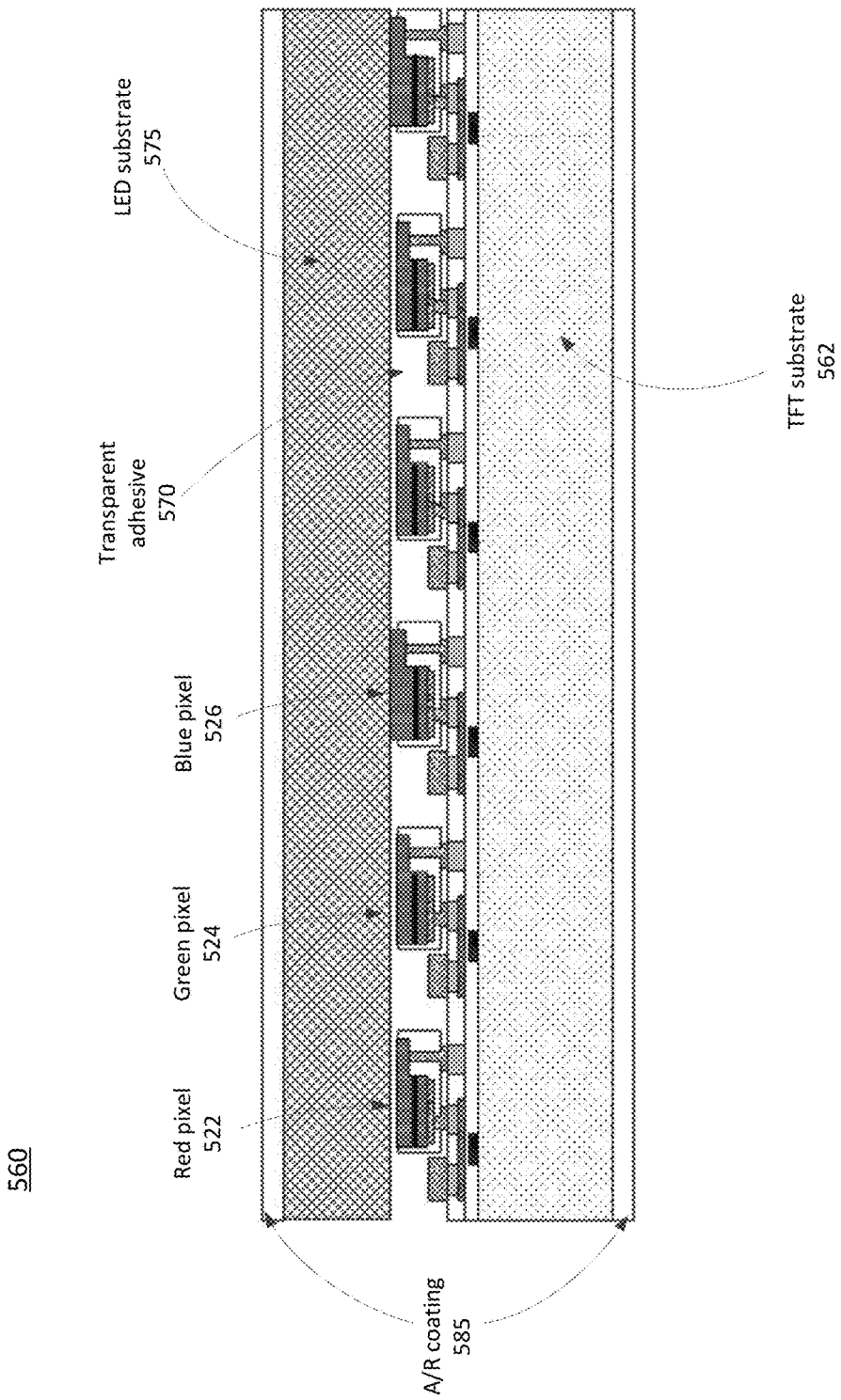
FIG. 5B is a cross-sectional view of a transparent TFT-LED display panel fabricated by wafer bonding without substrate removal, according to one embodiment.

FIG. 5B is a cross-sectional view of a transparent TFT-LED display panel, according to one embodiment. In this example, the red 522, green 524 and blue 526 pixels are formed by monolithic integration as described in FIG. 5A. However, the substrate 575 for the blue or green LED wafer is transparent and is not removed after wafer bonding. For example, the substrate may be sapphire. Instead, the LED substrate 575 remains on top of the display panel 560 and functions as a top protection cover. In some embodiments, the red LED epi is grown on a GaAs substrate, which is not transparent to visible light, and blue or Green LED epis are typically grown on sapphire substrates, which is transparent to visible light. The space between the LED substrate 575 and the TFT substrate 562 is filled with a transparent adhesive 570. If both substrates 575 and 562 are transparent, such as sapphire substrates and glass substrates, the display panel 560 will be transparent and with images visible from both the top and the bottom of the display panel. Anti-reflection coatings 585 may be applied to the outer surface of one or both substrates 575 and 562 to improve the optical performance of the display panel 560.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the monolithic integration of functional devices other than LEDs and TFT circuitry may function as other control circuitry for the functional devices. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other TFT control circuitry include current drivers, voltage drivers, transimpedence amplifiers, logic circuits, and other TFT circuitry that controls non-TFT functional devices.

Aspects of the invention can be used to integrate arrays of TFT pixel control circuits with arrays of devices made of materials other than silicon, for example photodetector arrays or power electronics circuit arrays. Typically, an active device uses a control circuit to achieve certain functions. If the active device is fabricated using a Si substrate, then the control circuit can readily be made on the same Si substrate. However, many active devices are made of materials other than Si due to performance or reliability requirements, and that material may not be suited for fabricating control circuits. In such cases, typically a separate chip for the control circuitry is needed. For single active devices, interconnect could be made through wirebondings and PCB traces. This becomes increasingly complicated, sometimes impossible, for an array of hundreds and thousands active devices made of a material other than Si to be connected to a separate control circuit array (which is usually a Si IC). Flip-chip bonding is widely used to integrate two chips with arrays of devices, but may suffer from issues of manufacturability, reliability, throughput, etc. However, the techniques described herein can be used to achieve true monolithic integration. Examples of such systems include the monolithic integration of control circuit array (e.g., TIA) with mid-IR photodectector array, and the monolithic integration of control circuit array with GaN power switch array.

Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A method for manufacturing an integrated LED display panel, comprising:
   growing epitaxial layers for an array of LEDs on a substrate, the epitaxial layers comprising a p layer, an n layer and an active region between the p and n layers;
   after the epitaxial layers have been grown on the substrate, directly fabricating an array of thin-film transistor (TFT) pixel drivers onto a structure containing the epitaxial layers and the same substrate on which the epitaxial layers were grown, and wherein the epitaxial layers are patterned to fabricate the array of LEDs; and
   forming electrical connections between the array of TFT pixel drivers and the array of LEDs, whereby the TFT pixel drivers are electrically connected to drive the array of LEDs.

2. The method of claim 1, further comprising:
   fabricating an insulating dielectric layer between the TFT pixel drivers and the substrate, the insulating dielectric layer electrically isolating the TFT pixel drivers from the substrate.

3. The method of claim 2, wherein growing the epitaxial layers on the substrate comprises:
   growing a bottom LED epitaxial layer that forms either the p or the n layer, the bottom LED epitaxial layer spanning between adjacent LEDs in the array of LEDs, the insulating dielectric layer positioned between the TFT pixel drivers and the bottom LED epitaxial layer.

4. The method of claim 2, wherein each TFT pixel driver includes at least a TFT control transistor, a TFT driving transistor and a storage capacitor, the method further comprising:
   fabricating conducting traces that electrically connect sources or drains of the IFT driving transistors to a top p or n region of the LEDs.

5. The method of claim 1, wherein the substrate is an insulating substrate and the TFT pixel drivers are fabricated directly onto the insulating substrate.

6. The method of claim 5, wherein each TFT pixel driver includes at least a TFT control transistor, a TFT driving transistor and a storage capacitor, the method further comprising:

fabricating conducting traces that electrically connect sources or drains of the TFT driving transistors to a top p or n region of the LEDs.

7. The method of claim 1, further comprising:

dividing the epitaxial layers into lateral cells, some of the lateral cells forming the LEDs, the TFT pixel drivers located above others of the lateral cells that do not form LEDs; and fabricating an insulating dielectric layer positioned between the TFT pixel drivers and the lateral cells that do not form LEDs.

8. The method of claim 7, wherein the TFT pixel drivers include bottom-gate TFT driving transistors, and the bottom-gate TFT driving transistors are positioned in their entirety above lateral cells that do not form LEDs.

9. The method of claim 7, wherein the TFT pixel drivers include top-gate TFT driving transistors, and the top-gate TFT driving transistors are positioned partly above lateral cells that do not form LEDs and partly above lateral cells that do form LEDs.

10. The method of claim 1, wherein the LEDs in the array of LEDs are all a same color.

11. The method of claim 1, wherein the LED display is a multi-color display.

12. The method of claim 11, wherein the LEDs in the array of LEDs are all a same color and the method further comprises:

fabricating different color phosphors, the different color phosphors positioned to be excited by the array of same color LEDs.

13. The method of claim 12, wherein all of the LEDs in the array are ultraviolet LEDs.

14. The method of claim 11, wherein the array of LEDs comprises different color LEDs.

\* \* \* \* \*

UNITED STATES PATENT AND TRADEMARK OFFICE
CERTIFICATE OF CORRECTION

| | | |
|---|---|---|
| PATENT NO. | : 10,079,264 B2 | Page 1 of 1 |
| APPLICATION NO. | : 15/135217 | |
| DATED | : September 18, 2018 | |
| INVENTOR(S) | : Lei Zhang, Fang Ou and Qiming Li | |

It is certified that error appears in the above-identified patent and that said Letters Patent is hereby corrected as shown below:

In the Claims

Column 10, Claim 4 Line 59, delete "IFT" and insert --TFT-- therefor

Signed and Sealed this
Twenty-sixth Day of November, 2019

Andrei Iancu
*Director of the United States Patent and Trademark Office*